United States Patent
Beck et al.

(10) Patent No.: US 7,193,794 B2
(45) Date of Patent: Mar. 20, 2007

(54) ADJUSTMENT ARRANGEMENT OF AN OPTICAL ELEMENT

(75) Inventors: Klaus Beck, Oberkochen (DE); Bernhard Gellrich, Aalen (DE); Hubert Holderer, Oberkochen (DE); Thomas Petasch, Aalen (DE); Cornelia Roesch, Oberkochen (DE); Alexander Kohl, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 54 days.

(21) Appl. No.: 10/779,392

(22) Filed: Feb. 13, 2004

(65) Prior Publication Data

US 2004/0174619 A1    Sep. 9, 2004

Related U.S. Application Data

(63) Continuation-in-part of application No. PCT/EP02/08758, filed on Aug. 6, 2002.

(30) Foreign Application Priority Data

Aug. 18, 2001  (DE) ................. 101 40 608

(51) Int. Cl.
*G02B 7/02* (2006.01)
(52) U.S. Cl. ...................... 359/822; 359/824
(58) Field of Classification Search ............ 359/819, 359/822–824; 369/44.14, 44.15
See application file for complete search history.

(56) References Cited

U.S. PATENT DOCUMENTS

| 4,778,252 A | * | 10/1988 | Filho ................... 359/819 |
| 4,993,823 A | | 2/1991 | Schaffer, Jr. et al. |
| 5,592,251 A | * | 1/1997 | Kai ....................... 396/55 |
| 6,191,898 B1 | | 2/2001 | Trunz et al. |
| 6,229,657 B1 | | 5/2001 | Holderer et al. |
| 6,259,571 B1 | | 7/2001 | Holderer et al. |
| 6,307,688 B1 | | 10/2001 | Merz et al. |
| 6,388,823 B1 | | 5/2002 | Gaber et al. |
| 6,392,825 B1 | | 5/2002 | Trunz et al. |

(Continued)

FOREIGN PATENT DOCUMENTS

EP    1 014 139    6/2000

(Continued)

OTHER PUBLICATIONS

Tomohiro Hoshino et al., "Improving ArF Lens performance and New generation high NA KrF optical system", *Proceedings of SPIE*, vol. 5377, pp. 768-776 (2004).

(Continued)

*Primary Examiner*—Hung Xuan Dang
*Assistant Examiner*—Joseph Martinez
(74) *Attorney, Agent, or Firm*—Fish & Richardson P.C.

(57) ABSTRACT

An arrangement serves for the adjustment of an optical element (1), in particular of a lens in an optical system, in particular in a projection lens system for semiconductor lithography. The optical element (1) is mounted in a mount (3) by means of a number of bearing feet (2) distributed over the circumference of the optical element (1) and is selectively deformable by actuators (5). At least some of the bearing feet (2) are engaged by the actuators (5) in a region of the respective bearing foot (2) in such a way that the respective bearing foot (2) can be displaced in the direction of the optical axis (7).

110 Claims, 3 Drawing Sheets

U.S. PATENT DOCUMENTS

| | | |
|---|---|---|
| 6,445,516 B2 | 9/2002 | Osterried |
| 6,525,888 B2 * | 2/2003 | Schletterer ................. 359/822 |
| 6,552,862 B2 | 4/2003 | Dieker |
| 6,556,364 B2 * | 4/2003 | Meehan et al. ............. 359/822 |
| 6,580,570 B2 | 6/2003 | Becker et al. |
| 6,816,325 B1 | 11/2004 | Becker et al. |
| 6,867,848 B2 | 3/2005 | Ebinuma et al. |
| 2004/0105177 A1 | 6/2004 | Ebinuma |
| 2005/0002011 A1 | 1/2005 | Sudoh |

FOREIGN PATENT DOCUMENTS

| | | |
|---|---|---|
| EP | 1 209 501 | 5/2002 |
| WO | WO 99/67683 | 12/1999 |

OTHER PUBLICATIONS

Yuji Sudoh et al., "A New Lens Barrel Structure Utilized on the FPA-6000AS4 and its Contribution to the Lens Performance", *Proceedings of SPIE*, vol. 5040, pp. 1657-1664 (2003).

Canon Semiconductor Equipment-"Pushing ARF to the limits", DNS Lithography Breakfast Forum at SEMICON West 2003; Phil Ware-Senior Fellow-Canon USA (Jul. 2003).

* cited by examiner

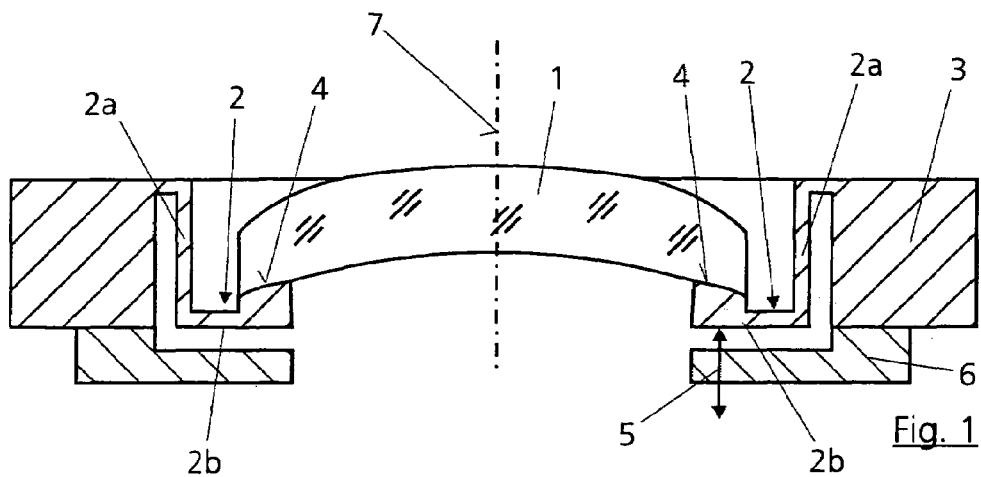
Fig. 1
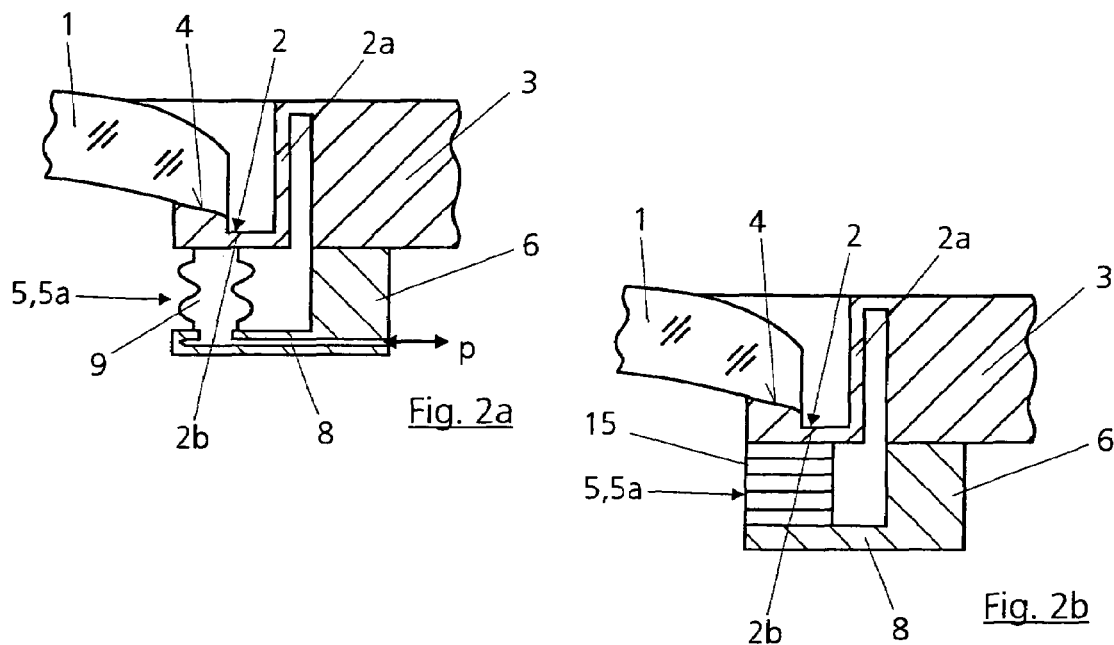
Fig. 2a
Fig. 2b
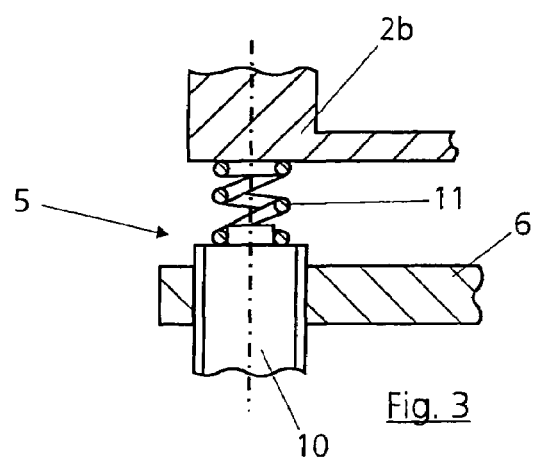
Fig. 3

ADJUSTMENT ARRANGEMENT OF AN OPTICAL ELEMENT

The following application is a continuation-in-part of PCT patent application No. PCT/EP02/08758, filed Aug. 6, 2002

FIELD OF THE INVENTION

The invention relates to an adjustment arrangement of an optical element, in particular of a lens in an optical system. The invention also relates to a projection lens system in semiconductor lithography with a number of optical elements and with at least one adjustment arrangement for an optical element.

BACKGROUND OF THE INVENTION

EP 1 014 139 A2 discloses an optical system for comparable purposes, in which an optical element, in particular a lens, is mounted on a multiplicity of angular bearing feet arranged in a uniformly distributed manner over the circumference of an inner ring or a mount. These bearing feet have the effect of providing on the one hand precise mounting and on the other hand appropriate elasticity for introducing deformations onto the lens as the optical element. The deformations are in this case applied to an inner ring of a mount that is connected to all the bearing feet and are transferred through the bearing feet to the region of the optical element.

However, it is a disadvantage of this arrangement that the specific deformation of the optical element is made more difficult by the distortions of the inner ring, which cannot be sufficiently predicted in each case, influencing the deformations that are to be transferred to the lens. The deformations of the inner ring are passed on to the optical element via a certain number of the bearing feet that are present. To distort the optical element in a specific way, it would have to be known exactly how the inner ring reacts to the respective distortions and how the latter are transferred to the optical element from the region of the inner ring and by which of the bearing feet.

Since, however, these effects cannot be calculated with the required accuracy and cannot be reproducibly repeated, this represents a disadvantage of such a construction, since the specific, punctiform transfer of deformations to the optical element is adversely affected by the construction in a way which cannot be reproduced.

For further prior art, reference is made to U.S. Pat. No. 4,993,823, WO 99/67683, U.S. Pat. No. 6,552,862 B2 and U.S. Pat. No. 6,580,570.

Incorporated by reference are U.S. Pat. No. 6,307,688, U.S. Ser. No. 10/002,097 and U.S. Ser. No. 10/661,183.

SUMMARY OF THE INVENTION

It is therefore the object of the present invention to provide a arrangement for the passive and active adjustment of an optical element which, apart from the required precise mounting and the simultaneously desired elasticity of the mounting, also allows the selective introduction of deformations into the region of the optical element.

This object is achieved according to the invention in the case of an adjustment arrangement of an optical element, in particular of a lens in an optical system, the optical element having a circumference and being mounted in a mount by a number of bearing feet arranged in a distributed manner over the circumference of the optical element, the optical element being selectively deformable by actuators, and at least some of the bearing feet being engaged by at least one actuator in such a way that the respective bearing foot can be displaced in a direction substantially orthogonal to said circumference.

The fact that the actuators engage in the region of the respective bearing foot in such a way that they displace the bearing foot itself, and consequently deform the optical element, allows very specific introduction of the desired deformations into the optical element to be achieved without this process being affected by the often unreproducible effects which could occur, for example, in the case of deformation of an inner ring of the mount.

It is for instance possible in a particularly advantageous way to achieve a deformation of the optical element by means of a force, without thereby changing the position of said element, by introducing the forces into the bearing feet. This is made possible by the pinpoint engagement in the region of the bearing feet, so that deformation and manipulation can be adjusted or regulated in relation to one another in such a way that they can be monitored.

In a particularly favorable development of the invention, the number of bearing feet is in this case significantly reduced in comparison with the prior art, since now the deformations are introduced into the optical element via the bearing feet themselves, and it is consequently possible to dispense with uniform fastening of the optical elements to an inner ring of a mount transferring the deformation. In this way, the number of bearing feet (for example 8, 12 or 16), which require comparatively great expenditure for their production and adjustment, is significantly reduced and the resting of the lens, on fewer bearing feet altogether, is improved with regard to the possibility of active, semi-active and passive adjustment.

Furthermore, the arrangement may be formed in such a way that, in a particularly favorable development of this idea, only some of the bearing feet, for example every second one, or bearing feet arranged at an appropriate angle in relation to one another, for example every 90°, are formed as bearing feet that can be manipulated. In this way the expenditure with regard to the actuators can be further reduced, the specific introduction of the deformation through the respective bearing feet themselves having the effect that the possibility of deforming the optical element is nevertheless improved in comparison with the prior art, since a more specific introduction of force takes place.

The adjustment arrangement according to the invention may be provided in an advantageous way in the case of an optical element that is provided in a projection lens system in semiconductor lithography, such as for example a lens.

For precise mounting, in particular low-deformation mounting, along with appropriate elasticity, the bearing feet may be appropriately adapted. For this purpose, they may be formed for example as solid joints, which may be formed for example in a U-shaped manner. For specific deformation of the optical element, actuators may then engage the bearing feet, for example where they are formed as solid joints.

CONCISE DESCRIPTION OF THE DRAWINGS

Further advantageous configurations of the invention emerge from the remaining subclaims and the exemplary embodiments, which are explained below on the basis of the drawing, in which:

FIG. 1 shows a representation of the principle of a construction according to the invention with an actuator indicated in principle;

FIGS. 2a and 2b show possible embodiments of an actuator in a construction according to FIG. 1;

FIG. 3 shows an alternative embodiment of an actuator in a construction according to FIG. 1;

DETAILED DESCRIPTION OF AN EMBODIMENT

Figure 4:
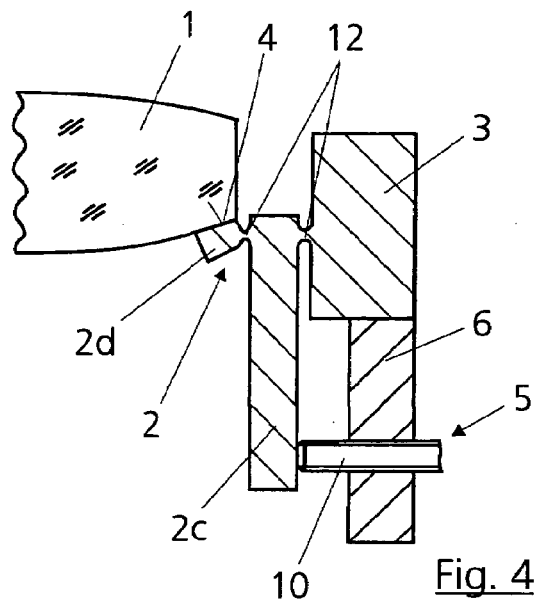
FIG. 4 shows an alternative possibility for the configuration of a bearing foot.

FIG. 1 shows an optical element 1, here a lens, which is mounted in a mount 3 by means of bearing feet 2. The bearing feet 2 are formed in an approximately L-shaped manner and are connected at their one leg 2a to the mount 3. At the free end of their other leg 2b, they have a bearing surface 4 for the optical element 1.

The bearing feet 2 are made with a comparatively small wall thickness, so that they have a certain intrinsic elasticity, which permits mounting of the optical element 1 in the mount 3 that is as ideal as possible and initially without any deformation, it being possible for the component referred to here as the mount 3 also to represent merely an inner ring of a mount that can be manipulated with respect to an outer ring.

The optical element 1 thus initially mounted without any deformation is then to be deformed in a way corresponding to the requirements of the optical system, in particular a lens system for semiconductor lithography, which is not represented in its entirety. For example, it may be meaningful to impress an astigmatism on the optical element 1. For this purpose, actuators 5, which are indicated in principle here by an arrow, are provided at least in the case of some of the bearing feet 2.

The actuator 5 is arranged in the region of a holding element 6, which is firmly connected to the mount 3, and in this way acts on the leg 2b of the bearing foot 2 having the bearing surface 4.

The arrow symbolizing the actuator 5 in this case points in both directions, although one direction is undoubtedly generally adequate for the action of the force, depending on the type of actuator 5, since the other direction of the force is realized by the force of gravity exerted by the optical element 1.

If all, or at least some, of the bearing feet 2 are then provided with such an actuator 5, the optical element 1 can be manipulated or deformed in this region by the respective actuator 5 in a direction orthogonal to the circumference which is mostly the direction of the optical axis 7, which in optics is generally referred to as the z direction.

In principle, it would undoubtedly be desirable here to achieve exclusive deformation of the optical element 1, without the optical element 1 thereby being changed in its position with regard to the optical axis 7, that is to say manipulated, by appropriate exposure of the individual bearing feet 2 to the appropriate forces. The possibility of providing the respective bearing feet 2 with the respective actuator 5 and in this way being able to introduce an appropriate direction of force virtually in every region of the optical element 1 allows such a meaningful deformation of the optical element 1 to be achieved.

FIG. 2a then shows an actual exemplary embodiment of one of the actuators 5, as already mentioned above in principle.

The actuator 5 is in this case configured as a pneumatic or hydraulic actuator 5a, that is to say is actuated by means of a pressure p. Here, too, the force of the weight exerted by the optical element 1 again acts as the restoring force.

The introduction of the force into the optical element 1 takes place by changing the pressure p, which is directed via a feed line 8 in the holding element 6 to a bellows 9 arranged between the holding element 6 and the one leg 2b of the bearing foot 2. Depending on the pressure p introduced, appropriate manipulation of the respective bearing foot 2 is obtained with the actuator 5a, and this in turn then brings about a deformation of the optical element 1 in precisely the region in which the bearing foot 2 is arranged.

FIG. 3 shows a further possibility for the configuration of the actuator 5.

The actuator 5 in the exemplary embodiment represented in FIG. 3 comprises an actuating screw 10, which acts on the leg 2b of the bearing foot 2 via a spring element 11. Here, too, the restoring force, against the force of the spring, is in turn applied by the force of the weight of the optical element 1.

In principle, it would in this case be possible in the exemplary embodiment represented here to configure the actuator 5 merely as an adjusting element, that is to say to use the actuating screw 10 for passive adjustment. As an alternative to this, it would of course also be possible here to provide the actuating screw 10 with an appropriate drive, for example a motor drive, in order to permit a semi-active possibility of adjustment in the form of an actuator during the operation of the optical system.

FIG. 4 then shows another embodiment of the bearing foot 2. The bearing foot 2 is formed here in one piece with the mount 3, which is also possible in principle in the case of the exemplary embodiments already mentioned above, but is not necessary there.

Here, the bearing foot 2 comprises a lever element 2c, which is connected by means of two solid joints 12 on one side to the mount 3 and on the other side to a part 2d of the bearing foot 2 that carries the bearing surface 4.

Since the solid joints 12 are spaced apart from each other by the width of the lever element 2c, there is the possibility of realizing a displacement of the part 2d, and consequently of the bearing surface 4, in the direction of the optical axis 7 when there is a deflection of the lever element 2c in a direction perpendicular to the optical axis 7.

In the exemplary embodiment represented in FIG. 4, this is achieved by an actuating screw 10 as the actuator 5, which engages on the side of the lever element 2c remote from the solid joints 12. The movement of the lever element 2c can be achieved by means of the actuating screw 10. This movement of the lever element 2c is thereby transferred in a monitored manner by the fastening of the lever element 2c by means of the solid joints 12 to the part 2d of the bearing feet 2 that is carrying the bearing surface 4, and consequently brings about the introduction of a force into the optical element 1 that at least runs onto the optical element 1 at least approximately in the direction of the optical axis 7. The actuating screw 10 may in this case of course again engage the lever element 2c by means of a spring element 11, which is not represented here however, or be designed as a pneumatic or hydraulic actuator.

In principle, it would of course also be conceivable and meaningful to configure all the actuators 5 of the exemplary embodiments presented so far and those still to be described later in some other form, for example as active actuators, for example by piezo elements or piezo stacks, and in this way produce specific deformations of the lens 1 during the operation of a lens system in which the lens 1 is installed, whereby the path of rays in the lens system can be correspondingly influenced.

FIG. 2b shows as an example a piezo stack 15, which takes the place of the hydraulic or pneumatic actuator 5a according to FIG. 2a.

As in the case of the exemplary embodiment described previously in FIG. 3, here, too, it is also possible for the actuating screw 10 in turn to be actuated actively as an actuator by means of a motor drive or the like, so that, apart from a purely passive adjustment, a semi-active readjustment of settling effects can also be performed during the operating period and, if appropriate, active control of the deformation of the optical element 1 can also be performed during actual operation.

As also already in the case of the exemplary embodiments described above, the force of the weight of the optical element 1 acts here as the restoring force, so that it is ensured by the force of the weight that the lever element 2c is always pressed against its actuator 5, so that a direct manipulation of the lever element 2c is possible.

Figures 5, 6:
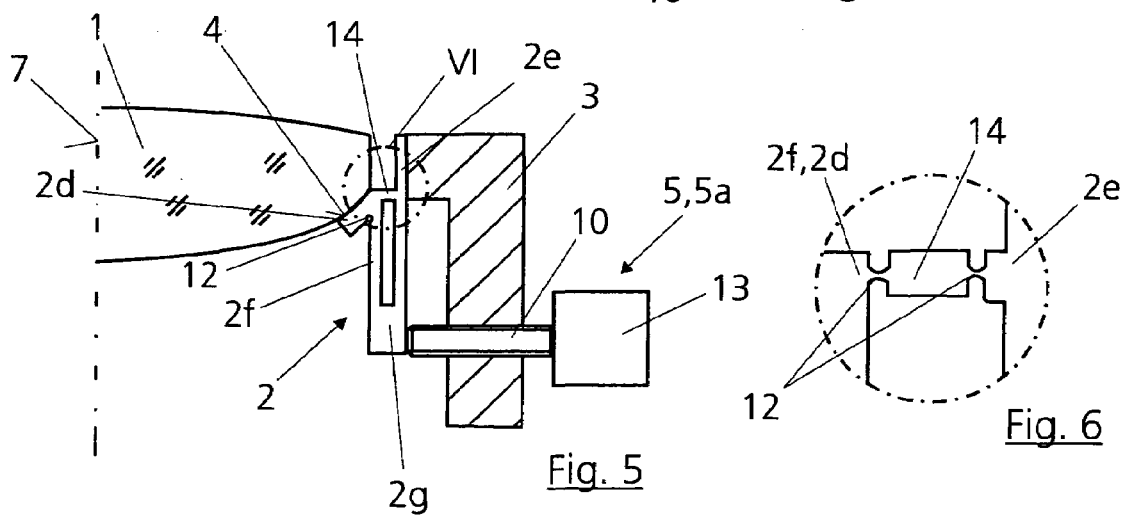
FIG. 5 shows a further alternative embodiment of the configuration of a bearing foot.
FIG. 6 shows an enlarged representation of the region VI from FIG. 5.

FIG. 5 then shows a further embodiment of the bearing foot 2, which in principle corresponds to the construction just described in FIG. 4 with the lever element 2c. However, the bearing foot 2 is in this case formed in a U-shaped manner, one leg 2e of the U-shaped bearing foot 2 being connected to the mount 3. This connection may either be realized again as a one-piece configuration of the bearing foot 2 with the mount 3 or it is also conceivable that, as represented here, the bearing foot 2 is connected to the mount 3 by means of appropriate connecting techniques, such as welding, adhesive bonding, screwing or the like.

The other leg 2f of the bearing foot 2 that is formed in a U-shaped manner carries on its side remote from a base element 2e the part of the bearing foot 2 that is designated by 2d and is connected to the optical element 1 via the bearing surface 4. To create a defined movement of the part 2d of the bearing foot 2 for the operation still to be explained in detail below, the at least one solid joint 12 is arranged between the part 2d and the leg 2f of the bearing foot 2.

By means of an actuating screw 10, which together with a motor drive 13 indicated in principle here, for example an electric motor, forms the actuator 5 in the form of an actuator 5a, the region of the base 2g of the bearing foot 2 can be displaced in a direction at least approximately perpendicular to the optical axis 7. The construction of the bearing foot 2 in its U-shaped configuration, which may also be regarded as a slotted lever, then brings about the effect of a manipulation of the part 2d of the bearing foot 2 against the force of the weight of the optical element 1.

The possibilities arising from this manipulation are the same as those already described above.

The construction described in FIG. 5 shows the possibility in this case, however, that it permits by its configuration an ideal possibility for introducing a stepping-up or stepping-down transmission movement of the actuator 5a onto the movement of the bearing surface 4. At the same time, this produces a comparatively soft construction which, when the actuator 5a is not operated, permits mounting of the optical element 1 in its starting position at least approximately without any deformation.

In order then to avoid any displacement of the optical element 1 in its plane perpendicular to the optical axis 7, the bearing foot 2 represented in FIG. 5 also has a stabilizing element 14, which is formed in the manner of a membrane or the like, so that in practice it does not impair the movement of the bearing foot 2 or of the bearing surface 4 in the direction of the optical axis 7, but effectively prevents the movement in the plane perpendicular thereto.

The stabilizing element 14 is represented once again in a detailed form in FIG. 6. The thickness of the stabilizing element 14 is made comparatively thin in comparison with the thicknesses of the two legs 2f, 2e of the bearing foot 2 and the stabilizing element 14 is connected to the respective legs of the bearing foot 2 via two solid joints 12.

This achieves the effect that a movement in the direction of the optical axis 7 can take place at least approximately unhindered, while a deflection of the optical element 1 in a plane perpendicular to the optical axis 7 is effectively prevented.

Figure 7:
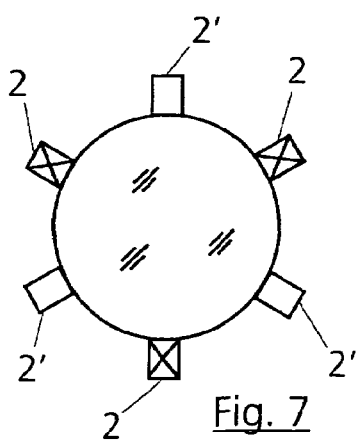
FIG. 7 shows a representation of the principle of a possible arrangement of manipulable bearing feet and fixed bearing feet.
Figure 8:
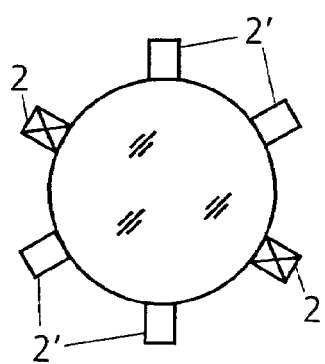
FIG. 8 shows an alternative possibility for arranging manipulable bearing feet and fixed bearing feet.
Figure 9:
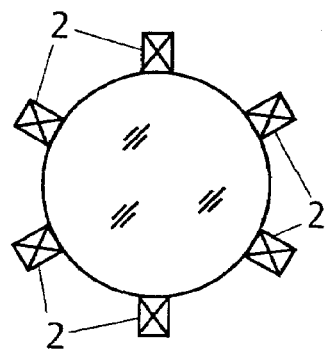
FIG. 9 shows a further alternative possibility for arranging manipulable bearing feet and fixed bearing feet.

FIGS. 7, 8 and 9 show various possibilities for arranging such bearing feet 2 that can be manipulated by means of an actuator 5 on their own or together with fixed bearing feet that are not provided with an actuator 5.

The fact that a deformation applied to the inner ring of the mount now no longer has to be introduced as uniformly as possible into the optical element 1, as in the case of the prior art, but that the bearing foot 2 itself can be manipulated in order to deform the optical element 1 in a specific way, means that far fewer bearing feet 2 than in the case of the prior art are now required.

In the exemplary embodiments represented here, six of the bearing feet 2 are respectively represented. The bearing feet identified by the cross are intended in this case to be the bearing feet 2 that have the appropriate actuator 5 or actuators 5a and consequently permit the possibility of introducing a deformation into the optical element 1 through a force acting in the direction of the optical axis 7.

The construction according to FIG. 7 allows three-wave (three-leaf clover) deformations of the optical element 1 to be applied, while the construction according to FIG. 8 permits the introduction of an astigmatism in one plane.

FIG. 9 shows the most variable construction, which however also involves the greatest expenditure with regard to the control of the actuators 5 or actuators 5a on account of the costs arising in production. In this construction, a number of deformations can be introduced into the optical element 1 and then be superposed in the latter to form the corresponding wave aberrations.

It would of course be quite conceivable also to realize a far greater number of fixed and/or manipulable bearing feet 2', 2, for example twelve or sixteen manipulable bearing feet allowing a multiplicity of wave aberrations to be produced in the optical element. In particular, however, it is meaningful if astigmatic and three-wave distortions can be introduced, which can be ideally realized for example in an arrangement with eight or twelve bearing feet. Higher-order wave aberrations are often of secondary importance for the quality of the optical imaging quality to be achieved. The expenditure in terms of costs and components could only be justified with difficulty from an economic viewpoint.

Figure 10:
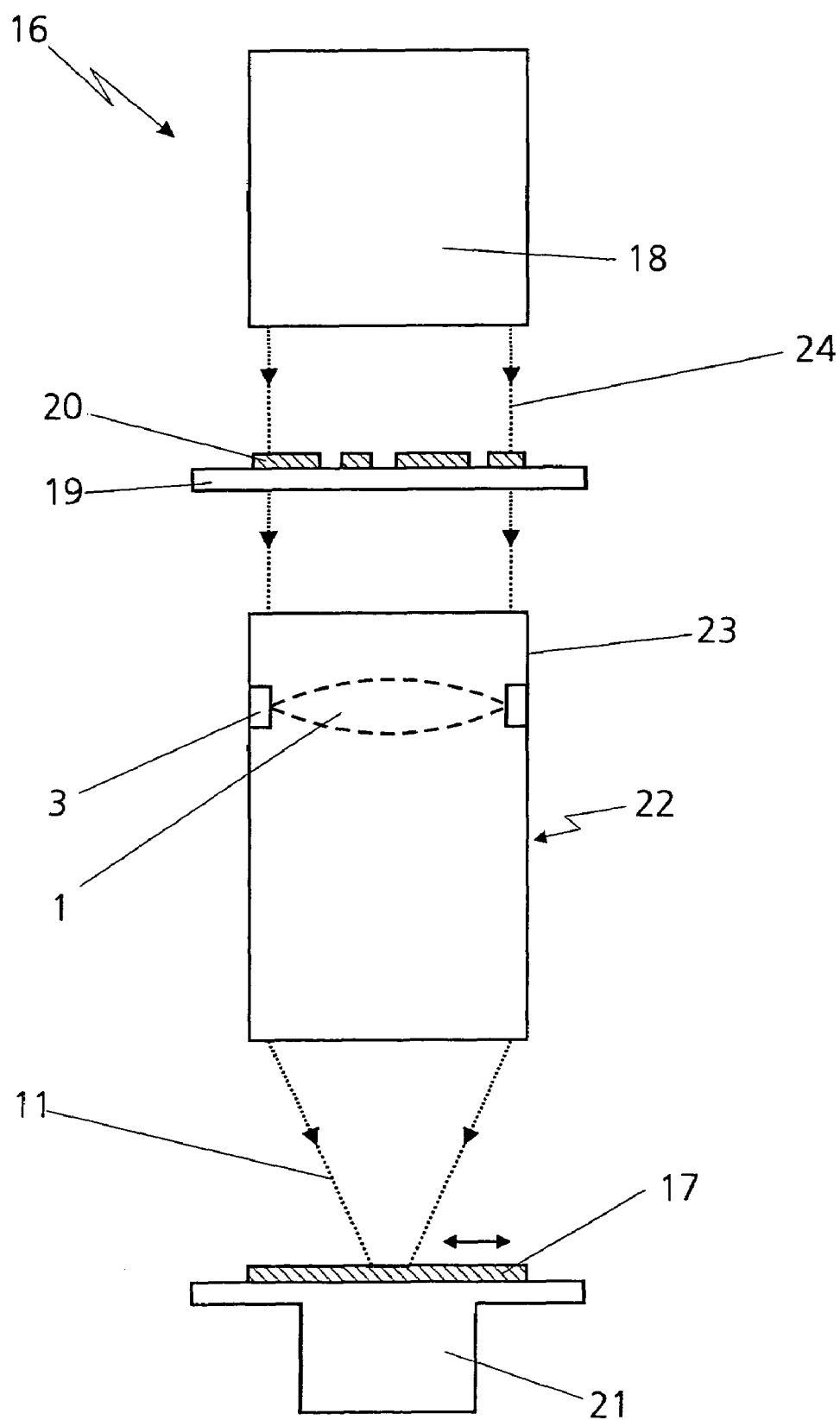
FIG. 10 shows a projection exposure machine with a projection lens system.

In FIG. 10, a projection exposure machine 16 for microlithography is represented in principle. This serves for exposing patterns on a substrate which is coated with photosensitive materials, generally consists predominantly of silicon and is referred to as a wafer 17, for the production of semiconductor arrangements, such as for example computer chips.

The projection exposure machine 16 in this case substantially comprises an exposure arrangement 18, a arrangement 19 for receiving and exactly positioning a mask provided with a grid-like pattern, the so-called reticle 20, by which the later patterns on the wafer 17 are determined, a arrangement 21 for securing, moving and exactly positioning this very wafer 17 and an imaging arrangement, to be specific a projection lens system 22 with a number of optical elements, such as for example lenses 1, which are mounted in a lens-system housing 23 of the projection lens system 22 by means of mounts 3.

The basic functional principle in this case provides that the patterns introduced into the reticle 20 are exposed onto the wafer 17 with a reduction in the size of the patterns.

Once exposure has taken place, the wafer 17 is moved further in the direction of the arrow, so that a multiplicity of individual zones, each with the pattern predetermined by the reticle 20, are exposed on the same wafer 17. On account of the step-by-step advancing movement of the wafer 17 in the projection exposure machine 16, the latter is also often referred to as a stepper.

The exposure arrangement 18 provides a projection beam 24, for example light or similar electromagnetic radiation, required for projecting the image of the reticle 20 onto the wafer 17. A laser or the like may be used as the source for this radiation. The radiation is shaped in the exposure arrangement 18 by means of optical elements in such a way that, when it impinges on the reticle 20, the projection beam 24 has the desired properties with regard to diameter, polarization, shape of the wave front and the like.

An image of the reticle 20 is produced by means of the projection beam 24 and transferred by the projection lens system 22 in an appropriately reduced size onto the wafer 17, as already explained above. The projection lens system 22 has a multiplicity of individual refractive and/or diffractive optical elements, such as for example lenses 1, mirrors, prisms, end plates and the like. In this case, one or more lenses 1 may be mounted in the way represented in FIGS. 1–9 and described above and adjusted or deformed in order to optimize the path of rays.

What is claimed is:

1. An adjustment arrangement of an optical element, in particular of a lens in an optical system, the optical system defining an optical axis, the optical element having a circumference and being mounted in a mount by a plurality of bearing feet arranged in a distributed manner over the circumference of the optical element, said bearing feet being formed in an L-shaped manner, the one leg of the bearing foot being connected at its free end to the mount, and a bearing surface for the optical element being arranged in the region of the free end of the other leg, the optical element being selectively deformable by actuators, and at least some of the bearing feet being engaged by at least one actuator in such a way that the respective bearing foot can be displaced in a direction substantially orthogonal to said circumference, wherein each of the bearing feet engaged by one of the actuators has a lever element running in a direction parallel to the optical axis, a bearing surface for the optical element and at least one pivot point, the actuator engaging in the region of the lever element in such a way that the bearing surface can be displaced in the direction of the optical axis, and each of the bearing feet engaged by one of the actuators has two pivot points formed as solid joints, which are arranged at least approximately in the region of a plane in which the centroid of the bearing surface also lies, the one end of the lever element being arranged between the two solid joints, the one solid joint connecting the lever element to the mount and the other solid joint connecting the lever element to the region of the bearing surface, and the actuator engaging the end of the lever element remote from the solid joints.

2. The adjustment arrangement as claimed in claim 1, characterized in that a force which runs parallel to the direction of the optical axis can be applied to the respective bearing foot by the actuators.

3. The adjustment arrangement as claimed in claim 2, characterized in that the force exerted by the actuators on the respective bearing feet acts on the respective region of the bearing foot in a direction perpendicular to the optical axis.

4. The adjustment arrangement as claimed in claim 3, characterized in that the actuating means are formed as an actuating screw.

5. The adjustment arrangement as claimed in claim 1, characterized in that each of the bearing feet engaged by one of the actuators is formed in a U-shaped manner, the one leg of the bearing foot being connected to the mount, and the other leg being connected to the region of the bearing surface via the at least one joint, and the actuator engaging in the region facing a base of the U-shaped bearing foot.

6. The adjustment arrangement as claimed in claim 5, characterized in that, on the side remote from the base of the U-shaped bearing foot, a stabilizing element is arranged between the two legs of the U-shaped bearing foot and is connected to each of the legs by a solid joint in each case, the two solid joints being arranged at least approximately in a plane which is formed at least approximately perpendicular to the optical axis.

7. The adjustment arrangement as claimed in claim 1, characterized in that the actuators are formed as passively adjustable actuating means.

8. The adjustment arrangement as claimed in claim 1, characterized in that the actuators are formed as active actuators.

9. The adjustment arrangement as claimed in claim 8, characterized in that the actuators act on the respective bearing foot via gear elements.

10. The adjustment arrangement as claimed in claim 9, characterized in that the gear element is formed as an actuating screw.

11. The adjustment arrangement as claimed in claim 8, characterized in that the actuators are formed as motor drives.

12. The adjustment arrangement as claimed in claim 8, characterized in that the actuators are formed as piezo elements or piezo stacks.

13. The adjustment arrangement as claimed in claim 8, characterized in that the actuators are formed as pneumatic or hydraulic actuators.

14. The adjustment arrangement as claimed in claim 1, characterized in that fixed bearing feet and bearing feet respectively engaged by one of the actuators are arranged alternately.

15. The adjustment arrangement as claimed in claim 1, characterized in that bearing feet which are engaged by one of the actuators are respectively arranged at specific angles around the optical element, the other bearing feet being formed as fixed bearing feet.

16. The adjustment arrangement as claimed in claim 15, characterized in that the bearing feet respectively engaged by one of the actuators are arranged in relation to one another at an angle of 120° in each case.

17. The adjustment arrangement as claimed in claim 15, characterized in that the bearing feet respectively engaged by one of the actuators are arranged in relation to one another at an angle of 90° in each case.

18. The projection lens system as claimed in claim 1, characterized in that a lens is provided as the optical element.

19. A projection lens system in semiconductor lithography with a number of optical elements, at least one optical element being mounted in a mount by a number of bearing feet arranged in a distributed manner over the circumference of the optical element, each of the bearing feet having two pivots formed as solid joints, one end of a lever element being arranged between the two solid joints, one of said solid joints connecting the lever element to the mount and the other solid joint connecting the lever element to a region of the optical element, and the actuator engaging an end of the lever element remote from the solid joints.

20. The projection lens system as claimed in claim 19, characterized in that the solid joints are arranged at least approximately in the region of a plane in which the centroid of the bearing surface also lies.

21. The projection lens system as claimed in claim 19, characterized in that each of the bearing feet engaged by one of the actuators is formed in a U-shaped manner, the one leg of the bearing foot being connected to the mount, and the other leg being connected to the region of the bearing surface via the at least one joint.

22. The projection lens system as claimed in claim 21, characterized in that, on the side remote from the base of the U-shaped bearing foot a stabilizing element is arranged between the two legs of the U-shaped bearing foot and is connected to each of the legs by a solid joint in each case, the two solid joints being arranged at least approximately in a plane which is formed at least approximately perpendicular to the optical axis.

23. The projection lens system as claimed in claim 21, characterized in that the actuator engages in the region facing a base of the U-shaped bearing foot.

24. The projection lens system as claimed in claim 19, characterized in that at least some of the bearing feet are engaged by actuators for the specific deformation of the optical element in such a way that the respective bearing foot can be displaced in the direction of the optical axis.

25. The projection lens system as claimed in claim 24, characterized in that the actuator engages the end of the lever element remote from the solid joints.

26. The projection lens system as claimed in claim 24, characterized in that the force exerted by the actuators on the respective bearing feet acts on the respective region of the bearing foot in a direction perpendicular to the optical axis.

27. The projection lens system as claimed in claim 24, characterized in that the actuators are formed as active actuators.

28. The projection lens system as claimed in claim 27, characterized in that the actuators act on the respective bearing foot via gear elements.

29. The projection lens system as claimed in claim 27, characterized in that the actuators are formed as motor drives.

30. The projection lens system as claimed in claim 27, characterized in that the actuators are formed as piezo elements or piezo stacks.

31. The projection lens system as claimed in claim 27, characterized in that the actuators are formed as pneumatic or hydraulic actuators.

32. The projection lens system as claimed in claim 24, characterized in that fixed bearing feet and bearing feet respectively engaged by one of the actuators are arranged alternately.

33. The projection lens system as claimed in claim 24, characterized in that bearing feet which are engaged by one of the actuators are respectively arranged at specific angles around the optical element, the other bearing feet being formed as fixed bearing feet.

34. The projection lens system as claimed in claim 33, characterized in that the bearing feet respectively engaged by one of the actuators are arranged in relation to one another at an angle of 120° in each case.

35. The projection lens system as claimed in claim 33, characterized in that the bearing feet respectively engaged by one of the actuators are arranged in elation to one another at an angle of 90° in each case.

36. The projection lens system as claimed in claim 19, characterized in that a lens is provided as the optical element.

37. A projection lens system in semiconductor lithography with a plurality of optical elements and with at least one optical element being mounted in a mount by a number of bearing feet arranged in a distributed manner over the circumference said bearing feet being formed in an L-shaped manner, with a free end thereof connected to the mount and a bearing surface for the optical element at an opposing end, the optical system defining an optical axis, the optical element being selectively deformable by actuators, and at least some of the bearing feet being engaged by at least one actuator in such a way that the respective bearing foot can be displaced in a direction substantially orthogonal to said circumference, wherein each of the bearing feet engaged by one of the actuators has a lever element running in a direction parallel to the optical axis, a bearing surface for the optical element and at least one pivot point, the actuator engaging in the region of the lever element in such a way that the bearing surface can be displaced in the direction of the optical axis, and each of the bearing feet engaged by one of the actuators has two pivot points formed as solid joints, the one end of a lever element being arranged between the two solid joints, the one solid joint connecting the lever element to the mount and the other solid joint connecting the lever element to a region of the bearing surface, and the actuator engaging the end of the lever element remote from the solid joints.

38. The projection lens system as claimed in claim 37, characterized in that a lens is provided as the optical element.

39. The projection lens system as claimed in claim 37, characterized in that the solid joints are arranged at least approximately in the region of a plane in which the centroid of the bearing surface also lies.

40. The projection lens system as claimed in claim 37, characterized in that each of the bearing feet engaged by one of the actuators is formed in a U-shaped manner, the one leg of the bearing foot being connected to the mount, and the other leg being connected to the region of the bearing surface via the at least one joint, and the actuator engaging in the region facing a base of the U-shaped bearing foot.

41. The projection lens system as claimed in claim 40, characterized in that, on the side remote from the base of the U-shaped bearing foot, a stabilizing element is arranged between the two legs of the U-shaped bearing foot and is connected to each of the legs by a solid joint in each case, said solid joints being arranged at least approximately in a plane which is formed at least approximately perpendicular to the optical axis.

42. The projection lens system as claimed in claim 37, characterized in that the force exerted by the actuators on the respective bearing feet acts on the respective region of the bearing foot in a direction perpendicular to the optical axis.

43. The projection lens system as claimed in claim 37, characterized in that the actuators are formed as passively adjustable actuating means.

44. The projection lens system as claimed in claim 43, characterized in that the actuating means are formed as an actuating screw.

45. The projection lens system as claimed in claim 37, characterized in that the actuators are formed as active actuators.

46. The projection lens system as claimed in claim 45, characterized in that the actuators act on the respective bearing foot via gear elements.

47. The projection lens system as claimed in claim 46, characterized in that the gear element is formed as an actuating screw.

48. The projection lens system as claimed in claim 45, characterized in that the actuators are formed as motor drives.

49. The projection lens system as claimed in claim 45, characterized in that the actuators are formed as piezo elements or piezo stacks.

50. The projection lens system as claimed in claim 45, characterized in that the actuators are formed as pneumatic or hydraulic actuators.

51. The projection lens system as claimed in claim 37, characterized in that fixed beating feet and bearing feet respectively engaged by one of the actuators are arranged alternately.

52. The projection lens system as claimed in claim 37, characterized in that bearing feet which are engaged by one of the actuators are respectively arranged at specific angles around the optical element, the other bearing feet being formed as fixed bearing feet.

53. The projection lens system as claimed in claim 52, characterized in that the bearing feet respectively engaged by one of the actuators are arranged in relation to one another at an angle of 120° in each case.

54. The projection lens system as claimed in claim 52, characterized in that the bearing feet respectively engaged by one of the actuators are arranged in relation to one another at an angle of 90° in each case.

55. The projection lens system as claimed in claim 37, characterized in that the bearing feet are provided with stabilizing elements.

56. An adjustment arrangement of an optical element, in particular of a lens in an optical system, the optical element having a circumference and being mounted in a mount by a number of bearing feet arranged in a distributed manner over the circumference of the optical element, the optical element being selectively deformable by actuators, and with alternate ones of the bearing feet being engaged by at least one actuator in such a way that the respective bearing foot can be displaced in a direction substantially orthogonal to said circumference.

57. The adjustment arrangement as claimed in claim 56, characterized in that a force which runs parallel to the direction of the optical axis can be applied to the respective bearing foot by the actuators.

58. The adjustment arrangement as claimed in claim 56, characterized in that each of the bearing feet is formed in an L-shaped manner, the one leg of the bearing foot being connected at its free end to the mount, and a bearing surface for the optical element being arranged in the region of the free end of the other leg.

59. The adjustment arrangement as claimed in claim 56, characterized in that each of the bearing feet engaged by one of the actuators has a lever element running in a direction parallel to the optical axis, a bearing surface for the optical element and at least one pivot point, the actuator engaging in the region of the lever element in such a way that the bearing surface can be displaced in the direction of the optical axis.

60. The adjustment arrangement as claimed in claim 59, characterized in that each of the bearing feet engaged by one of the actuators has two pivot points formed as solid joints, which are arranged at least approximately in the region of a plane in which the centroid of the bearing surface also lies, the one end of the lever element being arranged between the two solid joints, the one solid joint connecting the lever element to the mount and the other solid joint connecting the lever element to the region of the bearing surface, and the actuator engaging the end of the lever element remote from the solid joints.

61. The adjustment arrangement as claimed in claim 59, characterized in that each of the bearing feet engaged by one of the actuators is formed in a U-shaped manner, the one leg of the bearing foot being connected to the mount, and the other leg being connected to the region of the bearing surface via the at least one joint, and the actuator engaging in the region facing a base of the U-shaped bearing foot.

62. The adjustment arrangement as claimed in claim 61, characterized in that, on the side remote from the base of the U-shaped bearing foot, a stabilizing element is arranged between the two legs of the U-shaped bearing foot and is connected to each of the legs by a solid joint in each case, the two solid joints being arranged at least approximately in a plane which is formed at least approximately perpendicular to the optical axis.

63. The adjustment arrangement as claimed in claim 59, characterized in that the force exerted by the actuators on the respective bearing feet acts on the respective region of the bearing foot in a direction perpendicular to the optical axis.

64. The adjustment arrangement as claimed in claim 63, characterized in that the actuating means are formed as an actuating screw.

65. The adjustment arrangement as claimed in claim 56, characterized in that the actuators are formed as passively adjustable actuating means.

66. The adjustment arrangement as claimed in claim 56, characterized in that the actuators are formed as active actuators.

67. The adjustment arrangement as claimed in claim 66, characterized in that the actuators act on the respective bearing foot via gear elements.

68. The adjustment arrangement as claimed in claim 67, characterized in that the gear element is formed as an actuating screw.

69. The adjustment arrangement as claimed in claim 66, characterized in that the actuators are formed as motor drives.

70. The adjustment arrangement as claimed in claim 66, characterized in that the actuators are formed as piezo elements or piezo stacks.

71. The adjustment arrangement as claimed in claim 66, characterized in that the actuators are formed as pneumatic or hydraulic actuators.

72. The adjustment arrangement as claimed in claim 56, characterized in that bearing feet which are engaged by one of the actuators are respectively arranged at specific angles around the optical element, the other bearing feet being formed as fixed bearing feet.

73. The adjustment arrangement as claimed in claim 72, characterized in that the bearing feet respectively engaged by one of the actuators are arranged in relation to one another at an angle of 120° in each case.

74. The adjustment arrangement as claimed in claim 72, characterized in that the bearing feet respectively engaged by one of the actuators are arranged in relation to one another at an angle of 90° in each case.

75. The projection lens system as claimed in claim 56, characterized in that a lens is provided as the optical element.

76. The adjustment arrangement as claimed in claim 56, wherein at least one of the actuators is configured to apply an adjustable force to its respective bearing foot along only an upward direction, with the weight of the optical element configured to provide a downward force on the respective bearing foot.

77. The adjustment arrangement as claimed in claim 76, wherein each of the actuators is configured to apply an adjustable force to its respective bearing foot along only an upward direction, with the weight of the optical element configured to provide a downward force on the respective bearing foot.

78. The adjustment arrangement as claimed in claim 56, wherein at least one of the actuators is configured to apply an adjustable force to its respective bearing foot along one direction, but not the opposite direction.

79. The adjustment arrangement as claimed in claim 78, wherein each of the actuators is configured to apply an adjustable force to its respective bearing foot along one direction, but not the opposite direction.

80. The adjustment arrangement as claimed in claim 78, wherein the weight of the optical element provides a force on the respective bearing foot along the opposite direction.

81. The adjustment arrangement as claimed in claim 56, wherein the direction substantially orthogonal to said circumference is a direction substantially parallel to an optical axis for the optical element.

82. A projection lens system in semiconductor lithography with a number of optical elements and with at least one optical element being mounted in a mount by a number of bearing feet arranged in a distributed manner over the circumference, the optical and with alternate bearing feet being engaged by at least one actuator in such a way that the respective bearing foot can be displaced in a direction substantially orthogonal to said circumference.

83. The adjustment arrangement as claimed in claim 82, characterized in that a force which runs parallel to the direction of the optical axis can be applied to the respective bearing foot by the actuators.

84. The adjustment arrangement as claimed in claim 82, characterized in that each of the bearing feet is formed in an L-shaped manner, the one leg of the bearing foot being connected at its free end to the mount, and a bearing surface for the optical element being arranged in the region of the free end of the other leg.

85. The adjustment arrangement as claimed in claim 84, characterized in that each of the bearing feet engaged by one of the actuators has two pivot points formed as solid joints, which are arranged at least approximately in the region of a plane in which the centroid of the bearing surface also lies, the one end of the lever element being arranged between the two solid joints, the one solid joint connecting the lever element to the mount and the other solid joint connecting the lever element to the region of the bearing surface, and the actuator engaging the end of the lever element remote from the solid joints.

86. The adjustment arrangement as claimed in claim 85, characterized in that, on the side remote from the base of the U-shaped bearing foot, a stabilizing element is arranged between the two legs of the U-shaped bearing foot and is connected to each of the legs by a solid joint in each case, the two solid joints being arranged at least approximately in a plane which is formed at least approximately perpendicular to the optical axis.

87. The adjustment arrangement as claimed in claim 84, characterized in that each of the bearing feet engaged by one of the actuators is formed in a U-shaped manner, the one leg of the bearing foot being connected to the mount, and the other leg being connected to the region of the bearing surface via the at least one joint, and the actuator engaging in the region facing a base of the U-shaped bearing foot.

88. The adjustment arrangement as claimed in claim 84, characterized in that the force exerted by the actuators on the respective bearing feet acts on the respective region of the bearing foot in a direction perpendicular to the optical axis.

89. The adjustment arrangement as claimed in claim 88, characterized in that the actuating means are formed as an actuating screw.

90. The adjustment arrangement as claimed in claim 89, characterized in that the actuators act on the respective bearing foot via gear elements.

91. The adjustment arrangement as claimed in claim 89, characterized in that the actuators are formed as motor drives.

92. The adjustment arrangement as claimed in claim 89, characterized in that the actuators are formed as piezo elements or piezo stacks.

93. The adjustment arrangement as claimed in claim 89, characterized in that the actuators are formed as pneumatic or hydraulic actuators.

94. The adjustment arrangement as claimed in claim 93, characterized in that the bearing feet respectively engaged by one of the actuators are arranged in relation to one another at an angle of 120° in each case.

95. The adjustment arrangement as claimed in claim 93, characterized in that the bearing feet respectively engaged by one of the actuators are arranged in relation to one another at an angle of 90° in each case.

96. The adjustment arrangement as claimed in claim 82, characterized in that each of the bearing feet engaged by one of the actuators has a lever element running in a direction parallel to the optical axis, a bearing surface for the optical element and at least one pivot point, the actuator engaging in the region of the lever element in such a way that the bearing surface can be displaced in the direction of the optical axis.

97. The adjustment arrangement as claimed in claim 82, characterized in that the actuators are formed as passively adjustable actuating means.

98. The adjustment arrangement as claimed in claim 82, characterized in that the actuators are formed as active actuators.

99. The adjustment arrangement as claimed in claim 98, characterized in that the gear element is formed as an actuating screw.

100. The adjustment arrangement as claimed in claim 82, characterized in that bearing feet which are engaged by one of the actuators are respectively arranged at specific angles around the optical element, the other bearing feet being formed as fixed bearing feet.

101. The projection lens system as claimed in claim 82, characterized in that a lens is provided as the optical element.

102. The projection lens system as claimed in claim 82, wherein at least one of the actuators is configured to apply an adjustable force to its respective bearing foot along only an upward direction, with the weight of the optical element configured to provide a downward force on the respective bearing foot.

103. The projection lens system as claimed in claim 102, wherein each of the actuators is configured to apply an adjustable force to its respective bearing foot along only an upward direction, with the weight of the optical element configured to provide a downward force on the respective bearing foot.

104. The projection lens system as claimed in claim 82, wherein at least one of the actuators is configured to apply an adjustable force to its respective bearing foot along one direction, but not the opposite direction.

105. The projection lens system as claimed in claim 104, wherein each of the actuators is configured to apply an adjustable force to its respective bearing foot along one direction, but not the opposite direction.

106. The projection lens system as claimed in claim 104, wherein the weight of the optical element provides a force on the respective bearing foot along the opposite direction.

107. The projection lens system as claimed in claim 82, wherein the direction substantially orthogonal to said circumference is a direction substantially parallel to an optical axis for the optical element.

108. An adjustment arrangement of an optical element, in particular of a lens in an optical system, the optical system defining an optical axis, the optical element having a circumference and being mounted in a mount by a plurality of bearing feet arranged in a distributed manner over the circumference of the optical element, said bearing feet being formed in an L-shaped manner, the one leg of the bearing foot being connected at its free end to the mount, and a bearing surface for the optical element being arranged in the region of the free end of the other leg, the optical element being selectively deformable by actuators, and at least some of the bearing feet being engaged by at least one actuator in such a way that the respective bearing foot can be displaced in a direction substantially orthogonal to said circumference, so that a force running parallel to the direction of the optical axis can be applied to the respective bearing foot by the actuators, and each of the bearing feet engaged by one of the actuators has a lever element running in a direction parallel to the optical axis, a bearing surface for the optical element and at least one pivot point the actuator engaging in the region of the lever element in such a way that the bearing surface can be displaced in the direction of the optical axis, and each of the bearing feet engaged by one of the actuators has two pivot points formed as solid joints.

109. A projection lens system in semiconductor lithography with a plurality of lens and with at least one lens being mounted in a mount by a number of bearing feet arranged in a distributed manner over the circumference said bearing feet being formed in an L-shaped manner, with a free end thereof connected to the mount and a bearing surface for the lens at an opposing end, the optical system defining an optical axis, the lens being selectively deformable by actuators, and at least some of the bearing feet being engaged by at least one actuator in such a way that the respective bearing foot can be displaced in a direction substantially orthogonal to said circumference, wherein each of the bearing feet engaged by one of the actuators has a lever element running in a direction parallel to the optical axis, a bearing surface for the optical element and at least one pivot point, the actuator engaging in the region of the lever element in such a way that the bearing surface can be displaced in the direction of the optical axis, and each of the bearing feet engaged by one of the actuators has two pivot points formed as solid joints.

110. A projection lens system in semiconductor lithography with a plurality of optical elements and with at least one optical element being mounted in a mount by a number of bearing feet arranged in a distributed manner over the circumference said bearing feet being formed in an L-shaped manner, with a free end thereof connected to the mount and a bearing surface for the optical element at an opposing end, the optical system defining an optical axis, the optical element being selectively deformable by actuators, and at least some of the bearing feet being engaged by at least one actuator in such a way that the respective bearing foot can be displaced in a direction substantially orthogonal to said circumference, wherein each of the bearing feet engaged by one of the actuators has a lever element running in a direction parallel to the optical axis, a bearing surface for the optical element and at least one pivot point, the actuator engaging in the region of the lever element in such a way that the bearing surface can be displaced in the direction of the optical axis, and each of the bearing feet engaged by one of the actuators is formed in a U-shaped manner, the one leg of the bearing foot being connected to the mount, and the other leg being connected to the region of the bearing surface via the at least one joint, and the actuator engaging in the region facing a base of the U-shaped bearing foot, and on the side remote from the base of the U-shaped bearing foot, a stabilizing element is arranged between the two legs of the U-shaped-bearing foot and is connected to each of the legs by a solid joint in each case, said solid joints being arranged at least approximately in a plane which is formed at least approximately perpendicular to the optical axis.

* * * * *